United States Patent
Suzuki et al.

(10) Patent No.: US 10,215,781 B2
(45) Date of Patent: Feb. 26, 2019

(54) CURRENT SENSOR

(71) Applicant: Asahi Kasei Microdevices Corporation, Tokyo (JP)

(72) Inventors: Kenji Suzuki, Tokyo (JP); Hideto Imajo, Tokyo (JP); Daigo Takagi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 294 days.

(21) Appl. No.: 14/908,605

(22) PCT Filed: Nov. 21, 2013

(86) PCT No.: PCT/JP2013/006854
§ 371 (c)(1),
(2) Date: Jan. 29, 2016

(87) PCT Pub. No.: WO2015/015539
PCT Pub. Date: Feb. 5, 2015

(65) Prior Publication Data
US 2016/0187388 A1     Jun. 30, 2016

(30) Foreign Application Priority Data

Jul. 30, 2013 (JP) .................... 2013/157857

(51) Int. Cl.
*G01R 1/00*      (2006.01)
*G01R 15/20*     (2006.01)
(Continued)

(52) U.S. Cl.
CPC ....... *G01R 15/207* (2013.01); *G01R 19/0092* (2013.01); *G01R 1/00* (2013.01);
(Continued)

(58) Field of Classification Search
CPC ........ G01R 1/00; H01L 21/00; H01L 2221/00
See application file for complete search history.

(56) References Cited

U.S. PATENT DOCUMENTS 8,400,139 B2 *  3/2013  Ausserlechner ....... G01R 15/20
                                                         324/117 H
2004/0080308 A1   4/2004  Goto
(Continued)

FOREIGN PATENT DOCUMENTS

DE        10007967 A1     8/2001
DE     102011056187 A1    6/2012
(Continued)

OTHER PUBLICATIONS

International Search Report for International application No. PCT/JP2013/006854, dated Feb. 25, 2014.
(Continued)

*Primary Examiner* — Jermele M Hollington
*Assistant Examiner* — Temilade Rhodes-Vivour
(74) *Attorney, Agent, or Firm* — Morgan, Lewis & Bockius LLP (57) ABSTRACT

To provide a current sensor excellent in insulation resistance. A current sensor (1) includes a conductor (10); a support part (30) for supporting a signal processing IC (20); a magnetoelectric conversion element (13) configured to be electrically connectable to the signal processing IC (20), and arranged in a gap (10a) of the conductor (10) so as to detect a magnetic field generated by a current flowing through the conductor (10); and an insulation member (14) supporting the magnetoelectric conversion element (13).

24 Claims, 8 Drawing Sheets

(51) Int. Cl.
  *G01R 19/00* (2006.01)
  *H01L 21/00* (2006.01)
(52) U.S. Cl.
  CPC .......... *H01L 21/00* (2013.01); *H01L 2221/00* (2013.01); *H01L 2224/48091* (2013.01); *H01L 2224/48137* (2013.01); *H01L 2224/48247* (2013.01); *H01L 2924/181* (2013.01)

(56) References Cited

U.S. PATENT DOCUMENTS

| | | | |
|---|---|---|---|
| 2005/0045359 A1 | 3/2005 | Doogue et al. | |
| 2006/0219436 A1 | 10/2006 | Taylor et al. | |
| 2007/0188946 A1* | 8/2007 | Shoji | B82Y 25/00 360/324.12 |
| 2007/0200551 A1 | 8/2007 | Muraki et al. | |
| 2008/0143329 A1 | 6/2008 | Ishihara | |
| 2009/0295368 A1 | 12/2009 | Doogue et al. | |
| 2010/0156394 A1* | 6/2010 | Ausserlechner | G01R 15/202 324/144 |
| 2011/0202295 A1* | 8/2011 | Tamura | G01R 15/20 702/64 |
| 2011/0221429 A1* | 9/2011 | Tamura | G01R 15/207 324/244 |
| 2011/0234215 A1* | 9/2011 | Ausserlechner | G01R 15/20 324/244 |
| 2012/0038352 A1 | 2/2012 | Elian et al. | |
| 2012/0081110 A1* | 4/2012 | Racz | G01R 15/202 324/252 |
| 2012/0146164 A1 | 6/2012 | Ausserlechner | |
| 2012/0146165 A1 | 6/2012 | Ausserlechner et al. | |
| 2012/0319674 A1* | 12/2012 | El-Essawy | G01R 35/04 324/74 |
| 2013/0076343 A1* | 3/2013 | Carpenter | G01R 33/02 324/202 |

FOREIGN PATENT DOCUMENTS

| | | |
|---|---|---|
| EP | 1111693 A2 | 6/2001 |
| JP | H02-212789 A | 8/1990 |
| JP | 2001-174486 A | 6/2001 |
| JP | 2002-516396 A | 6/2002 |
| JP | 2003-014788 A | 1/2003 |
| JP | 2003-043074 A | 2/2003 |
| JP | 2003-510612 A | 3/2003 |
| JP | 2003-130895 A | 5/2003 |
| JP | 2005-017110 A | 1/2005 |
| JP | 2006-514283 A | 4/2006 |
| JP | 2008-151530 A | 7/2008 |
| JP | 2008-298761 A | 12/2008 |
| JP | 2008-545964 A | 12/2008 |
| JP | 2012-229950 A | 11/2012 |
| JP | 2013-079973 A | 5/2013 |
| JP | 2013-245942 A | 12/2013 |
| KR | 20-0315301 B1 | 6/2003 |
| KR | 10-2011-0020863 A | 3/2011 |
| WO | 2003/038452 A1 | 5/2003 |
| WO | 2004/072672 A1 | 8/2004 |
| WO | 2006/130393 A1 | 12/2006 |
| WO | 2009/148823 A1 | 12/2009 |
| WO | 2012/050048 A1 | 4/2012 |
| WO | 2013/008466 A1 | 1/2013 |

OTHER PUBLICATIONS

International Preliminary Report on Patentability and Written Opinion dated Feb. 11, 2016, for the corresponding International application No. PCT/JP2013/006854.
European Search Report issued in corresponding European Patent Application No. 13890772.0 dated Jul. 14, 2016.

* cited by examiner

CURRENT SENSOR

TECHNICAL FIELD

The present invention relates to a current sensor having a magnetoelectric conversion element.

BACKGROUND ART

A current sensor is known to have a magnetoelectric conversion element, for example, and output a signal whose amplitude is proportional to a magnetic field generated by a current flowing through a conductor. For example, in PTL 1, it is disclosed that a current sensor which includes a substrate, a magnetic field converter, i.e., a magnetoelectric conversion element provided on the substrate, and a current conductor, wherein the magnetoelectric conversion element detects a current flowing through the current conductor.

CITATION LIST

Patent Literature

PTL 1: WO 2006/130393 Pamphlet

SUMMARY OF INVENTION

Technical Problem

In the current sensor of PTL 1, although the substrate having the magnetoelectric conversion element is arranged on a lead frame via an insulator, there is a concern that the insulation resistance may decrease due to narrowing of the clearance between the substrate and the lead frame (FIG. 1 of PTL 1).

In addition, in the current sensor of PTL 1, one end of a conductive fastener having a current conductor part is fixed so as to define a clearance between the current conductor part provided at the other end of the conductive fastener and the magnetoelectric conversion element (FIG. 7 of PTL 1). However, the height of the current conductor part may have variation under the condition that only one end of the conductive fastener is fixed, and the clearance between the current conductor part and the magnetoelectric conversion element is likely to be affected by the variation. Accordingly, there has been a fear of decreased insulation resistance.

The present invention has been produced in view of the problem as described above, and it is an object thereof to provide a current sensor excellent in insulation resistance.

Solution to Problem

A current sensor proposed to solve the aforementioned problem includes a conductor having a gap; a support part for supporting a signal processing IC, the support part having a space for electrically insulating the support part from the conductor in plan view; a magnetoelectric conversion element configured to be electrically connectable to the signal processing IC, and provided in the gap of the conductor so as to detect a magnetic field generated by a current flowing through the conductor; and an insulation member supporting the magnetoelectric conversion element.

The current sensor may further include a signal terminal part having a lead terminal, and the support part may be configured to be electrically connectable to the signal terminal part.

The conductor may be arranged so as not to contact with the insulation member.

The conductor has a level difference, and the conductor may be arranged so as not to contact with the insulation member by the level difference.

Resin may be filled up between the conductor and the insulation member.

Advantageous Effects of Invention

According to the present invention, a current sensor having an excellent insulation resistance can be provided.

DESCRIPTION OF EMBODIMENTS

<First Embodiment>

Figure 1:
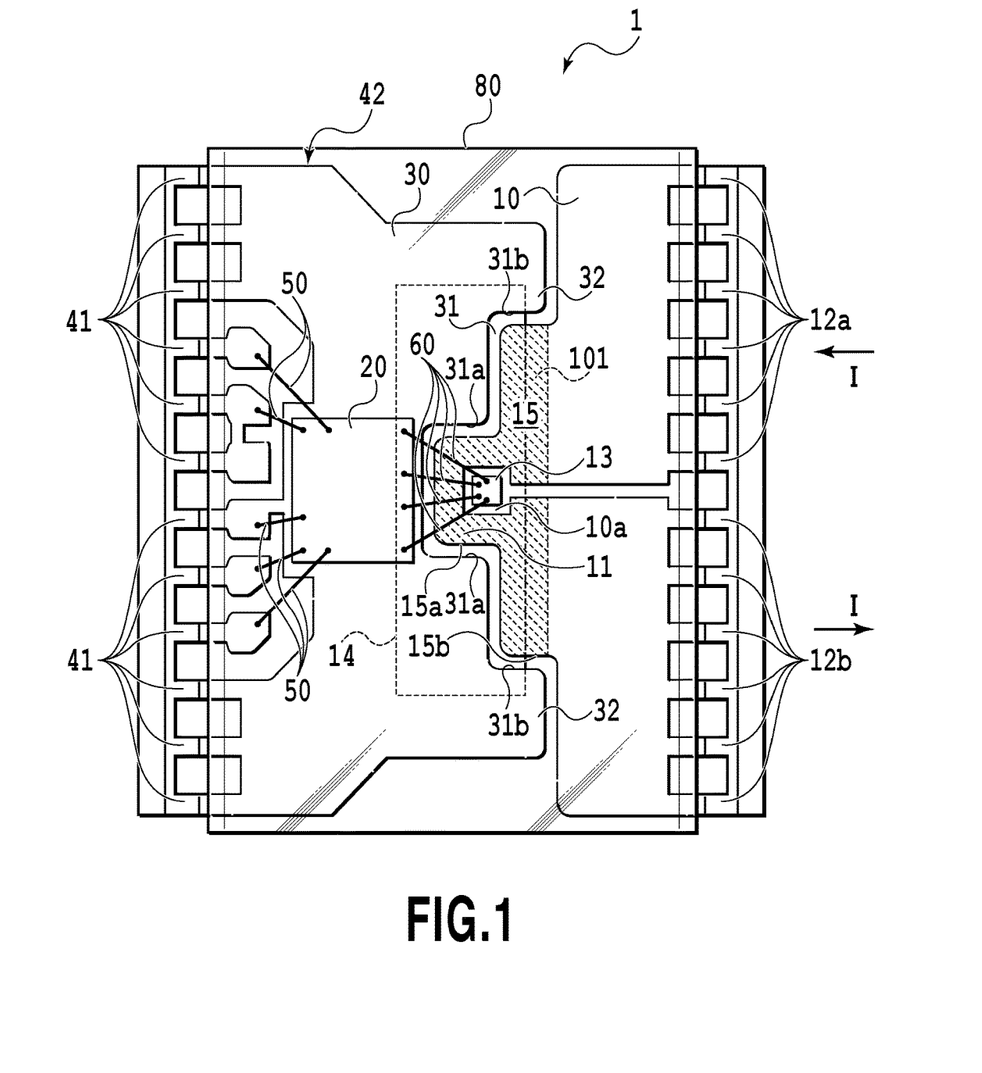
FIG. 1 is a top view showing an exemplary current sensor according to a first embodiment of the present invention.
Figure 2:
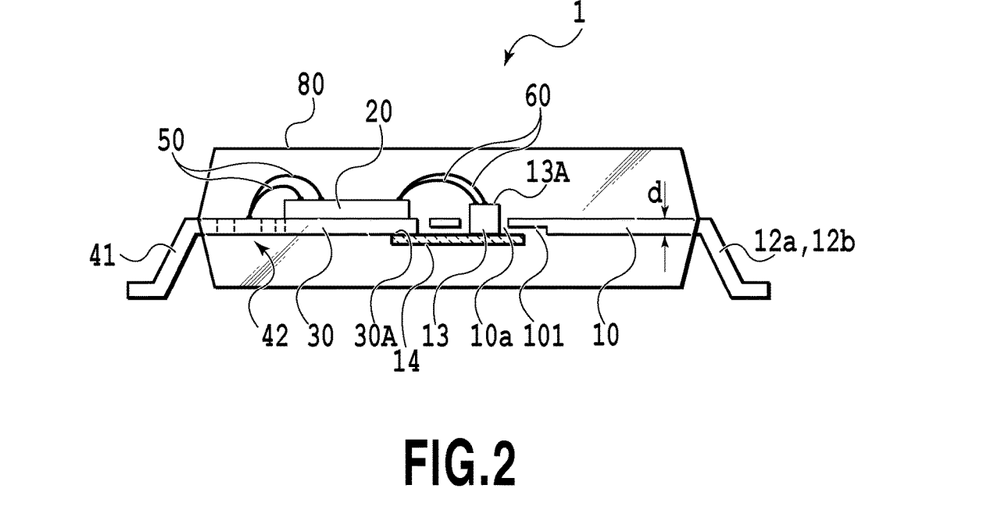
FIG. 2 is a side view of the current sensor of FIG. 1.
Figure 3:
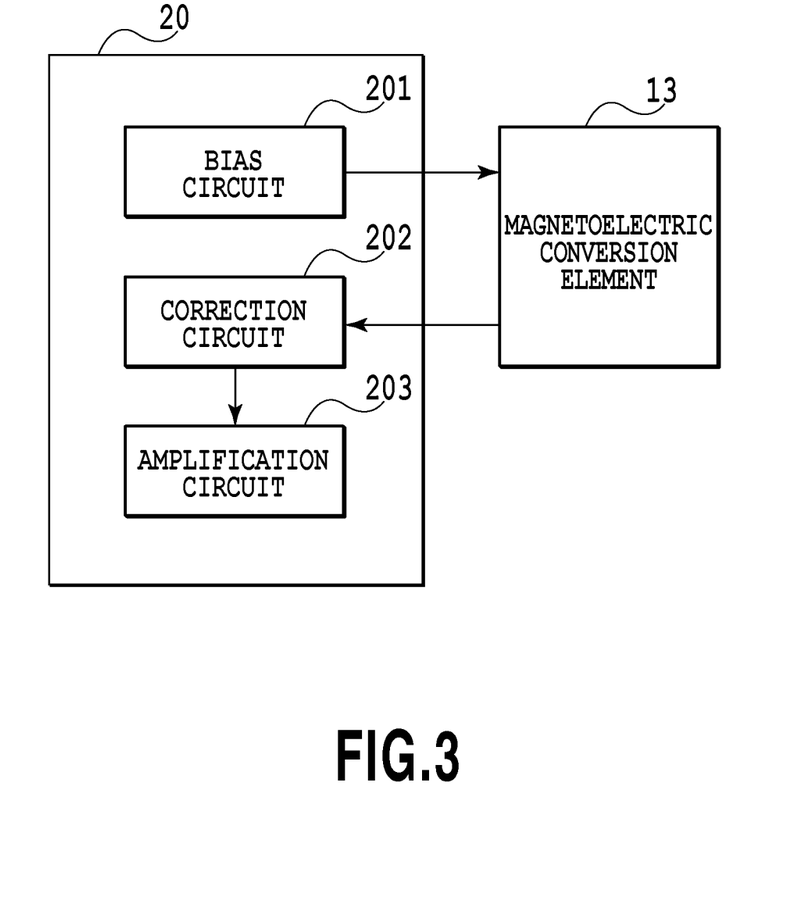
FIG. 3 shows an exemplary internal configuration of a signal processing IC.

With reference to FIGS. 1 to 3, an explanation will be hereinafter made for an exemplary embodiment of a current sensor of the present invention. A current sensor 1 according to the embodiment is, for example, a sensor having a magnetoelectric conversion element such as a hall element, to detect a current based on the magnetic flux density generated by a current.

FIG. 1 is a top view showing an exemplary configuration of the current sensor 1 according to a first embodiment. As shown in FIG. 1, the current sensor 1 includes a conductor 10 with, for example, twelve lead terminals 12a and 12b for causing a measured current to flow; a signal processing IC 20; a support part 30 for supporting the signal processing IC 20; and a signal terminal part 42 with, for example, twelve lead terminals 41. The number of lead terminals 12a, 12b and 41 is not limited to the example shown in FIG. 1 and may be changed.

In the present embodiment, the conductor 10 has a current path 11 through which a current I flows from the side of the lead terminal 12a to the side of the lead terminal 12b. In addition, a gap 10a is formed between the lead terminals 12a and 12b so as to extend along the shape of the current path 11. In the present embodiment, although the current path 11 is U-shaped, for example, the shape is not limited to the shape shown in FIG. 1 and any shape closed at one end will do as long as current detection can be performed in a magnetoelectric conversion element 13 described below. As the shape of the current path 11 of the conductor 10, a V-shape or C-shape for example, may also be applied. It is assumed that a shape like the U-, V- or C-shape is also included in the U-, V- or C-shape.

In the gap 10a of the conductor 10, a magnetoelectric conversion element 13 is arranged. The magnetoelectric conversion element 13 includes, for example, a hall element, a magnetoresistive element, a hall IC, and a magnetoresistance IC. In the current sensor 1 of the present embodiment, the conductor 10, the signal terminal part 42, the signal processing IC 20, and the magnetoelectric conversion element 13 are sealed with resin 80 to be formed in the same package, as shown in FIG. 1. The resin 80 is mold resin such as epoxy resin and the like.

When the current I flows through the conductor 10 in the current sensor 1, a magnetic field is generated according to the amount and the direction of the current flowing through the U-shape formed in the current path 11. The magnetoelectric conversion element 13 is arranged in the gap 10a in the proximity of the U-shaped current path 11, so as to detect the magnetic flux density generated by the aforementioned current and output an electrical signal according to the magnetic flux density to the signal processing IC 20.

The magnetoelectric conversion element 13 in the gap 10a is arranged spaced apart from the conductor 10 by the gap 10a, and always prevented from contacting with the conductor 10. Accordingly, electrical conduction does not happen between the conductor 10 and the magnetoelectric conversion element 13, whereby a space (clearance) for maintaining insulation is secured.

In addition, the magnetoelectric conversion element 13 is supported by an insulation member 14 (indicated by dashed lines in FIG. 1.). As the insulation member 14, for example an insulation tape made of a polyimide material with a high insulation withstand voltage is used. As the insulation member 14, not only a polyimide tape but also an insulation sheet made by applying adhesives to a polyimide material or a ceramic material may be applied, for example.

The back side of the conductor 10 has a level difference 101 (indicated by slant lines in FIG. 1.) formed thereon by coining, for example. The level difference 101 causes the conductor 10 to be arranged with a space in between from the insulation member 14. This will be described in detail below.

In FIG. 1, the conductor 10 and the signal processing IC 20 are arranged so as not to overlap with each other. A space is provided between the conductor 10 and the signal processing IC 20 for electrically insulating them from each other. Furthermore, a space is also provided between the conductor 10 and the support part 30 for electrically insulating them from each other.

The magnetoelectric conversion element 13 is electrically coupled to the signal processing IC 20 via a wire (metal line) 60, and the signal processing IC 20 is electrically coupled to the signal terminal part 42 via a wire (metal line) 50.

The signal processing IC 20 is composed of, for example, an LSI (Large Scale Integration) and, in the present embodiment, includes, for example, a memory, a processor, a bias circuit, a correction circuit, and an amplification circuit and the like. The circuit configuration of the signal processing IC 20 will be described in detail below.

FIG. 2 is a side view of the current sensor 1. As shown in FIG. 2, the insulation member 14 is formed so as to be joined to a part of a backside 30A of the support part 30, and support the magnetoelectric conversion element 13. The back side of the support part 30 refers to the side on which the signal processing IC 20 of the support part 30 is not arranged.

The back side of a part of the conductor 10 defining the gap 10a has the level difference 101 formed thereon. Due to the level difference 101, the conductor 10 is arranged so as to be always prevented from contacting with the insulation member 14. The level difference 101 shown in FIG. 2 is formed to be higher than the height of the insulation member 14. The reason for this is to prevent a creepage surface, which is formed when the insulator contacts with the electroconductive material, from existing between the insulation member 14 and the conductor 10.

In FIG. 2, mold resin is filled up between the back side of the conductor 10 and the insulation member 14.

If, in the current sensor 1 of the present embodiment, the insulation member 14 and the conductor 10 are configured so as to contact with each other, the aforementioned creepage surface is formed on the primary side of the current sensor 1. Therefore, the withstand voltage performance degrades in comparison with the case where the insulation member 14 and the conductor 10 are configured not to contact with each other. In addition, if heat load such as heat cycle is applied, detachment of the contact surface (interface between materials) is likely to occur, whereby the withstand voltage performance may further degrade.

In view of this, in the current sensor 1 of the present embodiment, the part of the level difference 101 of the conductor 10 is located above the insulation member 14 so that the insulation member 14 and the conductor 10 do not contact with each other by forming the aforementioned level difference 101 on the conductor 10. Accordingly, the insulation member 14 does not contact with the conductor 10, preventing the creepage surface from being formed on the primary side of the current sensor 1 (the side of the conductor 10). Therefore, formation of a creepage surface on the primary side of the current sensor 1 is prevented, and consequently the withstand voltage performance in the current sensor 1 is maintained and also degradation of the withstand voltage due to variation of the operational environment can be suppressed.

The insulation member 14 has an insulation tape made of a polyimide material excellent in withstand voltage performance, for example. The insulation member 14 is attached to the back side 30A of the support part 30 in a state as shown in FIG. 2 to support the magnetoelectric conversion element 13 from the back side.

In FIG. 2, the conductor 10 and the magnetoelectric conversion element 13 are provided on the same surface of the insulation member 14. In addition, the magnetoelectric conversion element 13 is arranged by being dropped downward into the gap 10a of the conductor 10 as deep as the thickness d of the conductor 10. Accordingly, in the current sensor 1, the height position of a magnetic sensitive surface 13A of the magnetoelectric conversion element 13 approaches the center position the thickness of the conductor 10. This allows a larger amount of magnetic flux generated by the current I flowing through the conductor 10 to be captured on the magnetic sensitive surface 13A of the magnetoelectric conversion element and, as a result, the current detection sensitivity increases.

Next, the shapes of the conductor 10 and the support part 30 will be described in detail, referring to FIG. 1 again.

The support part 30 has a concave part 31 which is recessed in the central portion of the support part 30 toward the side of the conductor 10 in plan view, and each of both sides of the support part 30 has a protrusion 32 projecting toward the side of the conductor 10. In the example of FIG. 1, the concave part 31 is formed so as to have concave parts 31a and 31b which are recessed in two stages, for example.

The conductor 10 has a convex part 15 which is formed so as to extend along the concave part 31 and the protrusion 32 of the support part 30 in plan view. In other words, the convex part 15 is formed so that the central portion of the conductor 10 protrudes toward the side of the support part 30 in plan view. In the example of FIG. 1, since the concave part 31 has the concave parts 31a and 31b which are recessed in two stages, the convex part 15 is also formed so as to have the convex parts 15a and 15b protruding in two stages.

In FIG. 1, the insulation member 14 is not supported at the side of the conductor 10, but is supported by at least the protrusion 32 of the back side of the support part 30. The insulation member 14 may be supported at the back side of the support part 30 other than the protrusion 32 (e.g., the lateral of both sides of the concave part 31a or/and the bottom of the concave part 31a).

Although the convex part 15 and the concave part 31 are illustrated for a case in which their shapes vary in two stages, for example, they may be configured in a staged manner such that their shapes vary in one stage or in three or more stages, for example. Alternatively, the convex part 15 may be formed such that the central portion of the conductor 10 (peripheral part of the gap 10a) protrudes gradually or continuously, and the concave part 31 may form a recess gradually or continuously so as to extend along the protrusion shape of the conductor 10.

In FIG. 1, the convex part 15 (15a, 15b) of the conductor 10 also has a multistage shape (two-stage shape) in accordance with the shape of the concave part 31 (31a, 31b) of the support part 30. Consequently, when a current flows through the conductor 10, the width of a part of the conductor 10 where the influence of magnetic flux generated at the part of the magnetoelectric conversion element 13 is relatively small widens, and therefore it is realized to reduce the resistance value of the entire conductor 10.

FIG. 3 is an exemplary circuit diagram of the signal processing IC 20. The signal processing IC 20 includes a bias circuit 201, a correction circuit 202, and an amplification circuit 203. The bias circuit 201 is coupled to the magnetoelectric conversion element 13 so as to supply power to the magnetoelectric conversion element 13. In other words, the bias circuit 201 is a circuit for applying (flowing) an excited current to the magnetoelectric conversion element 13.

The correction circuit 202 is configured to correct the output value of the magnetoelectric conversion element 13 in accordance with the temperature correction coefficient preliminarily stored in the memory, based on the operating temperature, for example. Accordingly, detection of current with a low temperature dependence and a high precision can be realized.

The amplification circuit 203 is configured to amplify the output value from the correction circuit 202.

Next, the outline of the manufacturing method of the current sensor 1 of the present embodiment will be described, referring to FIGS. 1 and 2.

First, the magnetoelectric conversion element 13 is die bonded on the insulation member 14 adhered to the lead frame (FIG. 2), and also the signal processing IC 20 is die bonded on the support part 30. Then, the magnetoelectric conversion element 13 and the signal processing IC 20 are wire bonded using wires 50 and 60 (FIG. 1). Then, the conductor 10, the magnetoelectric conversion element 13, the signal processing IC 20, and the signal terminal part 42 are molded using the resin 80 to perform lead cutting (FIG. 1). Then, lead terminals 12a and 12b at the high voltage side and a lead terminal 41 at the low voltage side are formed by forming (FIG. 1).

As has been described above, according to the current sensor 1 of the present embodiment, the conductor 10 and the signal processing IC 20 are spaced apart in top view of the electric sensor 1 for electrically insulating them from each other, and therefore have an excellent insulation resistance.

In addition, the insulation member 14 is supported by only the support part 30 without contacting with the conductor 10, and therefore prevents formation of a creepage surface between the conductor 10 and the insulation member 14, whereby the withstand voltage of the current sensor 1 becomes less likely to decrease.

<Second Embodiment>

Next, a second embodiment will be described, referring to FIGS. 4 and 5.

Although the magnetoelectric conversion element 13 is provided on the insulation member 14 in the current sensor 1 shown in FIG. 2, the current sensor 1A of the present embodiment is characterized in that the magnetoelectric conversion element 13 is provided on the insulation member 14 using a die attach film, whereby formation of a creepage surface is prevented more reliably.

Figure 4:
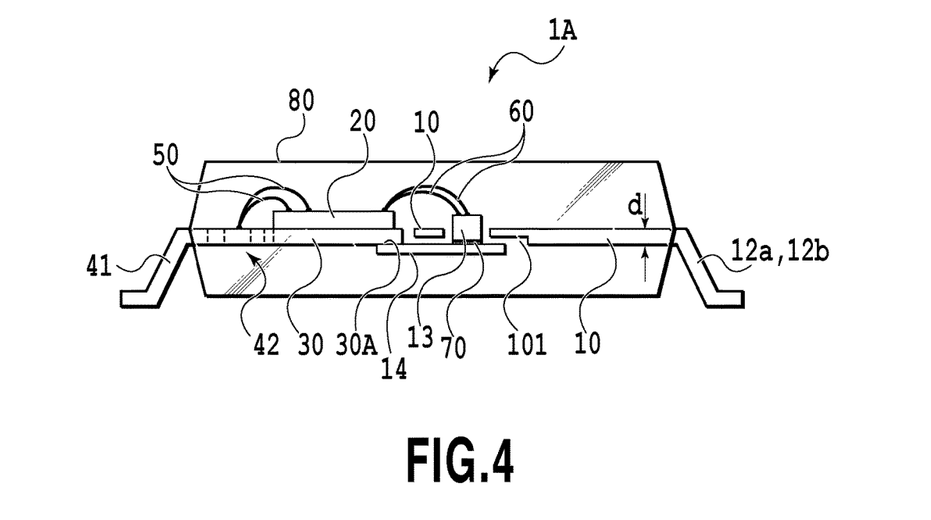
FIG. 4 is a side view showing an exemplary current sensor according to a second embodiment of the present invention.

FIG. 4 is a side view showing an exemplary configuration of the current sensor 1A according to the second embodiment. In the current sensor 1A, the magnetoelectric conversion element 13 is fastened on the insulation member 14 using a die attach film 70. The other components are the same as those of the first embodiment.

Since the die attach film 70 is attached to the back side of the wafer before dicing the wafer, the creepage surface does not extend so as to form a skirt part toward the conductor 10 surrounding the magnetoelectric conversion element 13, unlike the case of fixing the magnetoelectric conversion element 13 using insulation paste or conductive paste described below. Therefore, the withstand voltage of the current sensor further increases.

In general, the magnetoelectric conversion element 13 is fastened on the insulation member 14 using a die bond material. In the case of using conductive paste as the die bond material, the insulation distance between the magnetoelectric conversion element 13 and the conductor 10 is reduced by the skirt part of the paste. A creepage surface may be also formed due to the skirt part of the paste in the case of using insulation paste as the die bond material. The situation is shown in FIG. 5.

Figure 5:
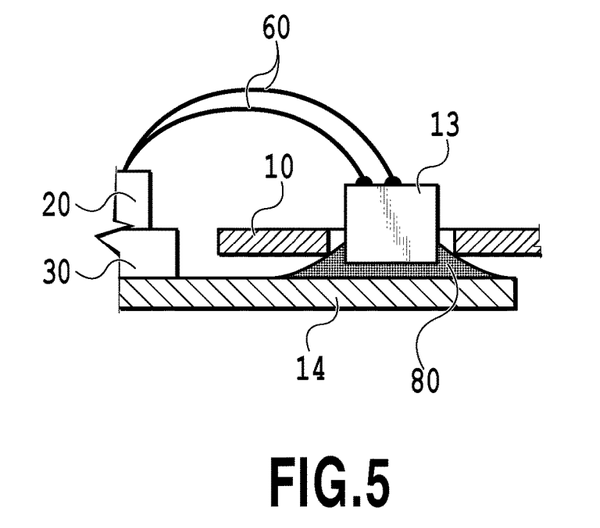
FIG. 5 illustrates an exemplary fastened state in which a magnetoelectric conversion element is fastened on an insulation member by use of a general type of resin paste.

In FIG. 5, the skirt part of the insulation paste 80 is in contact with the conductor 10 in the case where the magnetoelectric conversion element 13 is fastened on the insulation member 14 using insulation paste 80. In this case, the skirt part of the insulation paste 80 forms the aforementioned creepage surface and therefore facilitates detachment in the creepage surface due to the heat load of the heat cycle or the like, which may result in decrease of the withstand voltage of the current sensor.

<Third Embodiment>

Figure 6:
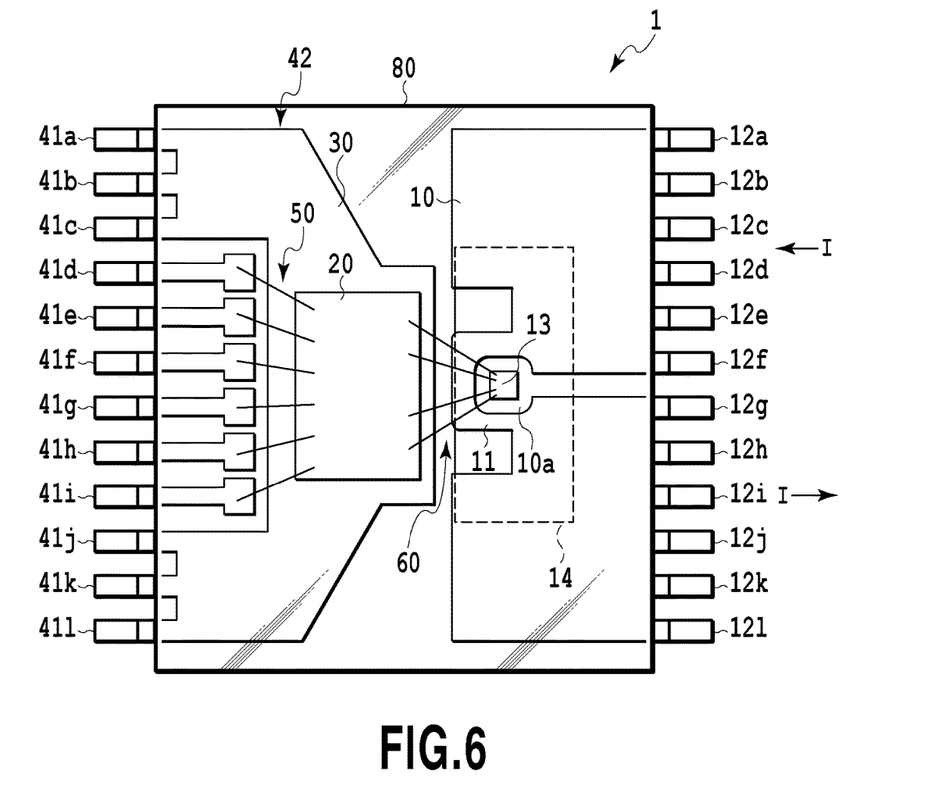
FIG. 6 is a top view showing an exemplary current sensor according to a third embodiment of the present invention.
Figure 7:
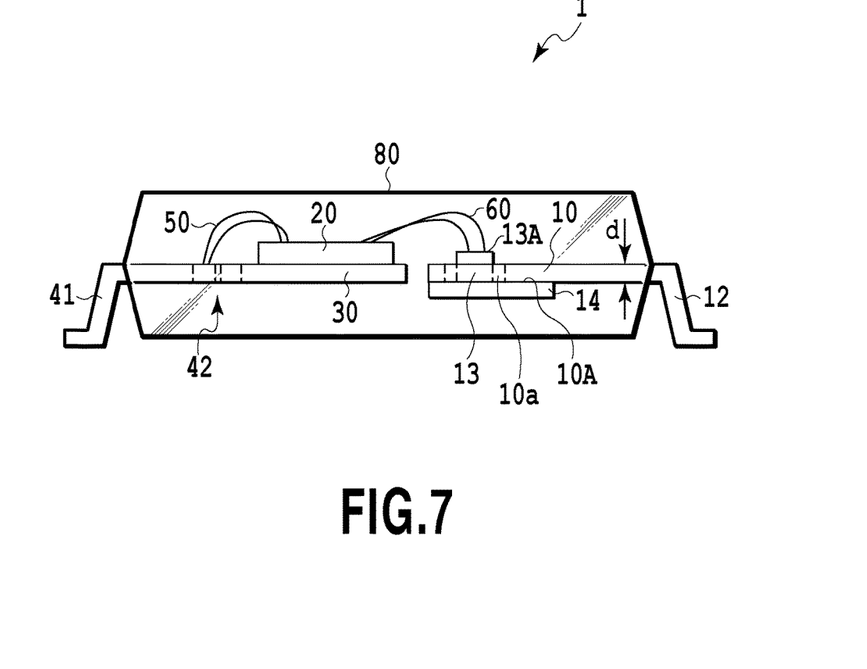
FIG. 7 is a side view of the current sensor of FIG. 6.

With reference to FIGS. 6 and 7, an explanation will be hereinafter made for an exemplary embodiment of a current sensor of the present invention. The current sensor 1 according to the embodiment is a sensor which has a magnetoelectric conversion element such as a hall element and the like, and detects a current based on the magnetic flux density generated by the current.

FIG. 6 is a top view showing an exemplary configuration of the current sensor 1 according to a third embodiment. As shown in FIG. 6, the current sensor 1 includes the conductor 10 with, for example, twelve lead terminals 12a to 12l for causing a measured current to flow; the signal processing IC 20; the support part 30 for supporting the signal processing IC 20; and the signal terminal part 42 having, for example, twelve lead terminals 41a to 41l. The number of lead terminals 12a to 12l, and 41a to 41l may be changed.

In the present embodiment, the conductor 10 has the current path 11 through which the current I flows from the side of the lead terminals 12a to 12f to the side of the lead terminals 12g to 12l. In addition, a gap 10a is formed between the lead terminals 12a to 12f and the lead terminals 12g to 12l so as to extend along the shape of the current path 11. In the present embodiment, although the current path 11 is U-shaped, for example, the shape is not limited to that shown in FIG. 6 and any shape closed at one end will do as long as current detection can be performed in the magnetoelectric conversion element 13 described below. As the shape of the current path 11 of the conductor 10, a V-shape or C-shape for example, may also be applied. Here, it is assumed that a shape according to the U-, V- or C-shape is also included in the U-, V- or C-shape.

The magnetoelectric conversion element 13 is arranged in the gap 10a of the conductor 10. The magnetoelectric conversion element 13 includes, for example, a hall element, a magnetoresistive element, a hall IC, or a magnetoresistive IC. In the current sensor 1 of the present embodiment, the conductor 10, the signal terminal part 42, the signal processing IC 20, and the magnetoelectric conversion element 13 are sealed with resin 80 to be formed in the same package, as shown in FIG. 6.

When the current I flows through the conductor 10 in the current sensor 1, a magnetic field is generated according to the amount and direction of the current flowing through the U-shape formed in the current path 11. The magnetoelectric conversion element 13 is disposed in the gap 11a in the proximity of the U-shaped current path 11, so as to detect the magnetic flux density generated by the aforementioned current and output an electrical signal according to the magnetic flux density to the signal processing IC 20.

The magnetoelectric conversion element 13 is supported and electrically insulated by the insulation member 14 (indicated by dashed lines and solid lines in FIG. 6.) formed on the back side of the conductor 10. In this embodiment, the insulation member 14 is formed so as to cover the U-shape part of the current path 11 of the conductor 10, and the magnetoelectric conversion element 13. Therefore, electrical conduction does not happen between the conductor 10 and the magnetoelectric conversion element 13 and thus a space (clearance) for maintaining the insulation is secured. Accordingly, a high insulation withstand voltage can be realized inside the package of the current sensor 1. As the insulation member 14, an insulation tape made of a polyimide material with a high withstand voltage, for example, is used. As the insulation member 14, not only a polyimide tape but also an insulation sheet made by applying an adhesive agent to a polyimide tape or a ceramic material may be applied, for example.

In the top view (plan view) of FIG. 6, the conductor 10 and the signal processing IC 20, and the conductor 10 and the support part 30 are arranged with a space therebetween so as not to overlap with each other for electrically insulating them from each other. Accordingly, the current sensor 1 with an excellent insulation resistance can be realized.

The magnetoelectric conversion element 13 is electrically coupled to the signal processing IC 20 via a metal line 60, and the signal processing IC 20 is electrically coupled to the signal terminal part 42 via a metal line 50.

The signal processing IC 20 has, for example an LSI (Large Scale Integration) and, in the present embodiment, includes, for example, a memory, a processor, a bias circuit, a correction circuit, and an amplification circuit and the like.

The bias circuit is coupled to the magnetoelectric conversion element 13 so as to supply power to the magnetoelectric conversion element 13. In other words, the bias circuit is a circuit for applying (flowing) an excited current to the magnetoelectric conversion element 13.

The correction circuit is configured to correct the output value of the magnetoelectric conversion element 13 in accordance with the temperature correction coefficient preliminarily stored in the memory, based on the operating temperature, for example. Accordingly, detection of current with a low temperature dependence and a high precision can be realized.

The amplification circuit is configured to amplify the output value from the correction circuit.

FIG. 7 is a side view of the current sensor 1 of FIG. 6. As shown in FIG. 7, the insulation member 14 is formed on the back side 10A of the conductor 10. In the present embodiment, the insulation member 14 with, for example, an insulation tape made of a polyimide material having an excellent withstand voltage, is attached to the back side of the conductor 10, in a state as shown in FIG. 7.

In the present embodiment, the conductor 10 and the magnetoelectric conversion element 13 are provided on the same surface of the insulation member 14. The magnetoelectric conversion element 13 is arranged by being dropped downward into the gap 10a of the conductor 10 as deep as the thickness d of the conductor 10. Accordingly, in the current sensor 1, the height position of the magnetic sensitive surface 13A of the magnetoelectric conversion element 13 approaches the thickness center position of the conductor 10. This allows a larger amount of magnetic flux generated by the current I flowing through the conductor 10 to be captured on the magnetic sensitive surface 13A of the magnetoelectric conversion element and, as a result, the current detection sensitivity increases.

As has been described above, according to the current sensor 1 of the present embodiment, the conductor 10 and the signal processing IC 20 are spaced apart in top view of the electric sensor 1 for electrically insulating them from each other, and therefore have an excellent insulation resistance.

<Fourth Embodiment>

As an embodiment of the current sensor, a current sensor 1A configured to increase the current detection sensitivity will be described. Although the overall configuration of the current sensor 1A is generally similar to that of the embodiment shown in FIG. 6, the configuration with a magnetic material is different from that of the embodiment. The configuration of the current sensor 1A in the exemplary variation will be hereinafter described, focusing on the difference from the embodiment.

Figure 8:
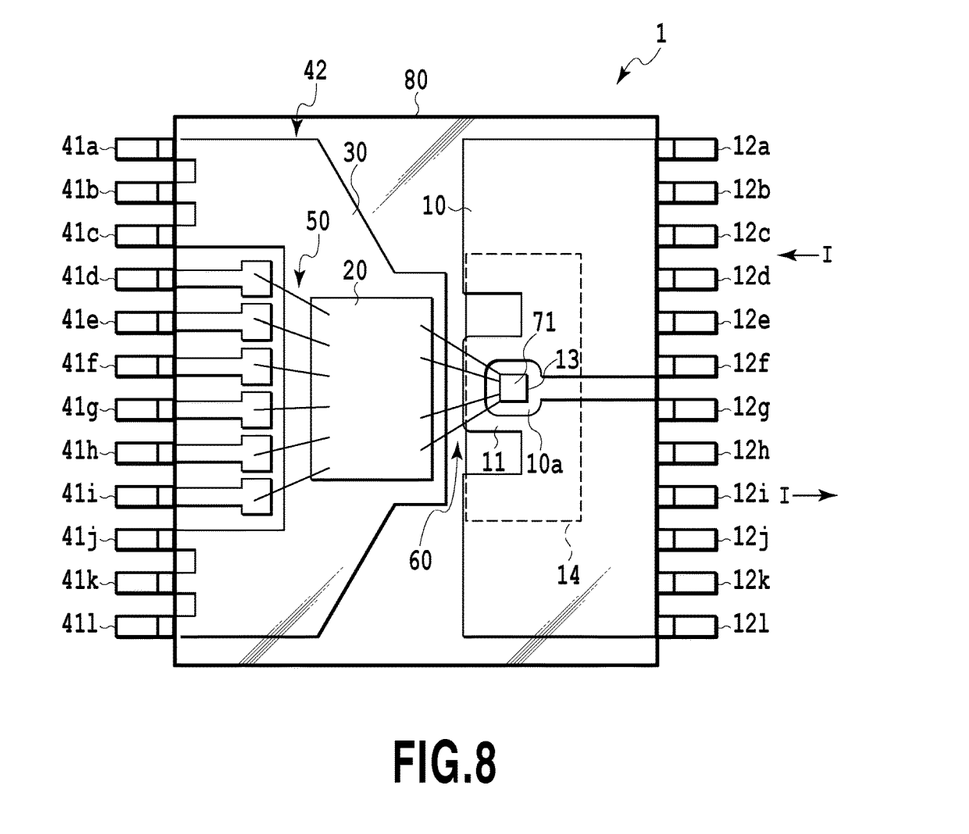
FIG. 8 is a top view showing an exemplary current sensor according to a fourth embodiment of the present invention.

FIG. 8 is a top view showing an exemplary configuration of the current sensor 1A according to a fourth embodiment. As shown in FIG. 7, the current sensor 1A includes, as is the case with the current sensor shown in FIG. 6, the conductor 10 with, for example, twelve lead terminals 12a to 12l; the signal processing IC 20 arranged with a space in between for electrically insulating from the conductor 10; the support part 30 for supporting the signal processing IC 20; and the signal terminal part 42 with, for example, twelve lead terminals 41a to 41l. The current sensor 1A has, in the gap 10a of the conductor 10, the magnetoelectric conversion element 13 supported by the insulation member 14. By such a configuration, the current sensor 1A also has an excellent insulation resistance.

In the present embodiment, on the other hand, unlike the one shown in FIG. 6, a magnetic material 71 is formed on the magnetoelectric conversion element 13 (on the magnetic sensitive surface 13A) by magnetic body plating, for example. As an exemplary configuration of the magnetic material 71, a magnetic chip such as ferrite can be also used. Accordingly, when the current I flows through the conductor 10, the magnetic flux generated by the current I is likely to converge on a magnetosensitive part 13A of the magnetoelectric conversion element 13. Therefore, the current detection sensitivity of the current sensor 1A increases.

[Exemplary Variation]

The current sensors 1 and 1A according to each of the aforementioned embodiments are only illustrative, and can be changed as follows.

A case of providing the conductor 10 with the level difference 101 in the current sensors 1 and 1A of the first and second embodiments has been described. However, the level difference 101 need not be provided by configuring the height of the conductor 10 to be higher than the insulation member 14. According to such a configuration, the insulation member 14 is supported by only the support part 30 without contacting with the conductor 10, and thereby preventing formation of a creepage surface between the conductor 10 and the insulation member 14, and the withstand voltage of the current sensor 1 becomes less likely to decrease.

In the current sensors 1 and 1A of the first to fourth embodiments, a single magnetoelectric conversion element 13 is applied, however, two or more magnetoelectric conversion elements may be used, for example.

The current sensors 1 and 1A of the first to fourth embodiments may be applied to a semiconductor package, or may be realized as a single chip.

REFERENCE SIGNS LIST 1,1A current sensor
10 conductor
10a gap
11 current path
12a, 12b, 41, 41 to 41l lead terminal
13 magnetoelectric conversion element
14 insulation member
20 signal processing IC
30 support part
42 signal terminal part
70 die attach film
71 magnetic material

The invention claimed is:

1. A current sensor comprising:
a conductor having a gap;
a support part for supporting a signal processing IC, the support part having a space for electrically insulating the support part from the conductor in plan view;
a magnetoelectric conversion element configured to be electrically coupled to the signal processing IC, and disposed in the gap of the conductor so as to detect a magnetic field generated by a current flowing through the conductor; and
an insulation member supporting the magnetoelectric conversion element,
wherein the conductor, the support part, the magnetoelectric conversion element, and the insulation member are sealed with resin and accommodated inside a house formed by the resin.

2. The current sensor according to claim 1, further comprising a signal terminal part having a lead terminal, wherein the support part is configured to be electrically coupled to the signal terminal part.

3. The current sensor according to claim 1, wherein the conductor is arranged so as not to contact with the insulation member.

4. The current sensor according to claim 3, wherein:
the conductor has a level difference, and
the conductor is arranged so as not to contact with the insulation member by the level difference.

5. The current sensor according to claim 3, wherein the resin is filled up between the conductor and the insulation member.

6. The current sensor according to claim 1, wherein the insulation member is arranged so as to contact with the conductor.

7. The current sensor according to claim 1, wherein the insulation member is arranged so as to contact with a surface opposite to a surface on which the signal processing IC of the support part is arranged.

8. The current sensor according to claim 1, wherein the conductor has a U-, V- or C-shaped current path.

9. The current sensor according to claim 1, wherein the magnetoelectric conversion element is arranged in a gap of the U-, V- or C-shaped current path.

10. The current sensor according to claim 8, wherein the U-, V- or C-shaped current path is open in a direction opposite to a direction in which the support part lies in plan view.

11. The current sensor according to claim 1, wherein the magnetoelectric conversion element is configured so as to be electrically insulated from the conductor by being supported by the insulation member.

12. The current sensor according to claim 1, wherein a pressure-sensitive adhesive layer or an adhesive layer is provided between the insulation member and the magnetoelectric conversion element.

13. The current sensor according to claim 1, wherein the insulation member is an insulation tape or an insulation sheet applied with pressure-sensitive adhesives or adhesives.

14. The current sensor according to claim 1, wherein the magnetoelectric conversion element is die bonded with the insulation member using a die attach film.

15. The current sensor according to claim 1, wherein the magnetoelectric conversion element is a hall element or a magnetoresistive element.

16. The current sensor according to claim 1, wherein the magnetoelectric conversion element is arranged by being dropped downward into the gap of the conductor as deep as the thickness of the conductor.

17. The current sensor according to claim 1, wherein the magnetoelectric conversion element is arranged on the insulation member so that the height of the magnetic sensitive surface of the magnetoelectric conversion element is substantially equal to the height of the conductor.

18. The current sensor according to claim 1, wherein the magnetoelectric conversion element is arranged on the insulation member so that the height of the magnetic sensitive surface of the magnetoelectric conversion element is substantially equal to the center height in the thickness direction.

19. The current sensor according to claim 1, wherein:
the support part is formed with a concave portion, the concave portion is recessed in the middle of the support part toward the conductor side in plan view, and each of both sides of the concave portion has a protrusion portion projecting toward the conductor side, the conductor has a convex portion extending along the concave portion and the protrusion portion of the support part in plan view, and the insulation member contacts the back side of the protrusion portion.

20. The current sensor according to claim 1, wherein the signal processing IC has a bias circuit for applying an excited current to the magnetoelectric conversion element, a correction circuit configured to correct a signal obtained from the magnetoelectric conversion element, and an amplification circuit for amplifying the corrected signal.

21. The current sensor according to claim 1, further comprising a magnetic material formed on the magnetic sensitive surface of the magnetoelectric conversion element.

22. A current sensor comprising:

a conductor having a gap;

a support part for supporting a signal processing IC, the support part having a space for electrically insulating the support part from the conductor in plan view;

a magnetoelectric conversion element configured to be electrically coupled to the signal processing IC, and disposed in the gap of the conductor so as to detect a magnetic field generated by a current flowing through the conductor; and an insulation member supporting the magnetoelectric conversion element, wherein the conductor is arranged so as not to make contact with the insulation member, and wherein resin is filled up between the conductor and the insulation member.

23. A current sensor comprising:

a conductor having a gap;

a support part for supporting a signal processing IC, the support part having a space for electrically insulating the support part from the conductor in plan view;

a magnetoelectric conversion element configured to be electrically coupled to the signal processing IC, and disposed in the gap of the conductor so as to detect a magnetic field generated by a current flowing through the conductor; and an insulation member supporting the magnetoelectric conversion element, wherein a pressure-sensitive adhesive layer or an adhesive layer is provided between the insulation member and the magnetoelectric conversion element.

24. A current sensor comprising:

a conductor having a gap;

a support part for supporting a signal processing IC, the support part having a space for electrically insulating the support part from the conductor in plan view;

a magnetoelectric conversion element configured to be electrically coupled to the signal processing IC, and disposed in the gap of the conductor so as to detect a magnetic field generated by a current flowing through the conductor; and an insulation member supporting the magnetoelectric conversion element, wherein the insulation member is an insulation tape or an insulation sheet applied with pressure-sensitive adhesives or adhesives.

* * * * *